US012775046B2

(12) United States Patent
Putrams

(10) Patent No.: US 12,775,046 B2
(45) Date of Patent: Oct. 27, 2026

(54) INTEGRATED WIND-TURBINE MONITORING

(71) Applicant: AERONES INC., San Jose, CA (US)

(72) Inventor: Janis Putrams, Riga (LV)

(73) Assignee: Aerones Engineering, SIA, Riga (LV)

( * ) Notice: Subject to any disclaimer, the term of this patent is extended or adjusted under 35 U.S.C. 154(b) by 161 days.

(21) Appl. No.: 18/726,272

(22) PCT Filed: Jan. 10, 2023

(86) PCT No.: PCT/IB2023/050209
§ 371 (c)(1),
(2) Date: Jul. 2, 2024

(87) PCT Pub. No.: WO2023/135517
PCT Pub. Date: Jul. 20, 2023

(65) Prior Publication Data

US 2025/0102575 A1 Mar. 27, 2025

Related U.S. Application Data

(60) Provisional application No. 63/298,566, filed on Jan. 11, 2022.

(51) Int. Cl.
*G01R 31/327* (2006.01)

(52) U.S. Cl.
CPC ..... *G01R 31/3275* (2013.01); *G01R 31/3274* (2013.01)

(58) Field of Classification Search
CPC ... F03D 80/30; F03D 80/301; G01R 31/3274; G01R 31/3275; F05B 2240/85
See application file for complete search history.

(56) References Cited

U.S. PATENT DOCUMENTS

2018/0048136 A1* 2/2018 Aspas Puertolas .... G01R 31/54
2021/0140409 A1* 5/2021 Schlüter .................. F03D 17/00

FOREIGN PATENT DOCUMENTS

CN 112502913 A * 3/2021 ............. F03D 7/022
CN 112963318 A * 6/2021 ............... F03D 7/04
(Continued)

OTHER PUBLICATIONS

International Search report for PCT/IB2023/050209, prepared by the European Patent Office, mailing date Mar. 24, 2023, 4 pages.

*Primary Examiner* — Ryan C Clark
(74) *Attorney, Agent, or Firm* — Brooks Kushman P.C.

(57) ABSTRACT

An electronic device for integrated monitoring of a wind turbine is configured to selectively electrically couple to a lightning-protection system that is included within a wind-turbine blade or wing. The electronic device may establish the electrical coupling when the wind-turbine blade is orientated below a horizontal direction (such as an orientation having an angle between 180° and 360°). Then, the electronic device may characterize the wind-turbine blade using time-domain reflectometry or using a wide variety of measurements, such as pressure, humidity, acoustic, vibration, etc. Measurement results may be communication from the electronic device to a remote computer (such as a cloud-based computer system) for analysis. When the analysis identifies potential damage to the wind-turbine blade, the remote computer and/or the electronic device may perform a remedial action, such as recommending enhanced inspection and/or a repair.

14 Claims, 5 Drawing Sheets

(56) References Cited

FOREIGN PATENT DOCUMENTS

| | | | | | |
|---|---|---|---|---|---|
| EP | 2525460 | A1 | | 11/2012 | |
| EP | 3503331 | B1 | * | 9/2022 | .......... H02J 13/1333 |
| JP | 2021025859 | A | * | 2/2021 | |
| WO | WO-2018135940 | A2 | * | 7/2018 | ............ F03D 80/60 |

* cited by examiner

INTEGRATED WIND-TURBINE MONITORING

CROSS-REFERENCE TO RELATED APPLICATION

This application is the U.S. national phase of PCT Application No. PCT/IB2023/050209 filed on Jan. 10, 2023, which claims the benefit of U.S. Provisional Patent Application No. 63/298,566 filed on Jan. 11, 2022, the disclosures of which are incorporated in their entirety by reference herein.

TECHNICAL FIELD

The invention relates to techniques for performing integrated inspection or monitoring of a wind turbine.

BACKGROUND ART

Wind energy is often harnessed using wind turbines. However, wind turbines are subject to damage (such as leading-edge erosion or crack formation) because of factors such as: lightning, a harsh environment (e.g., temperature cycling, salt exposure, ice formation, etc.), infestation (e.g., insects), dust, algae, etc. Consequently, wind turbines require regular inspection and, as needed, maintenance.

Existing approaches to wind-turbine inspection typically involve ceasing operation of a wind turbine in order to perform visual inspection and/or measurements. However, ceasing operation of a wind turbine decreases its uptime and, thus, increases the cost of inspection. Moreover, this increased cost of inspection provides an incentive to decrease the frequency of inspection, which can adversely impact maintenance costs and/or the operating life of wind turbines.

SUMMARY OF THE INVENTION

The invention discloses an integrated wind-turbine monitoring electronic device, comprising: a disconnect device configured to selectively electrically couple to a lightning-protection cable in a wind-turbine blade; and a measurement device, electrically coupled to the disconnect device, configured to perform, when the disconnect device is selectively electrically coupled to the lightning-protection cable, time-domain reflectometry measurements of lightning-protection cable by performing operations comprising: (i) providing an electrical signal to the lightning-protection cable; and (ii) measure reflected electrical signals from the lightning-protection cable. The electronic device may comprise a control logic configured to selectively provide a control signal to the disconnect device to change a state of the disconnect device from connected to disconnected and vice versa.

The measurement device can be configured to measure: an amplitude of the reflected electrical signals, a phase of the reflected electrical signals, or both. The measurement device can be further configured to analyze the measured reflected electrical signals to detect whether there is potential damage to the lightning-protection cable. The analysis can be based at least in part on a predetermined signature of the lightning-protection cable. The analysis can be performed using a pretrained predictive model, comprising a neural network; or a supervised-learning model. The analysis can be based at least in part on: a previous measurement performed on the wind-turbine blade; a previous measurement performed on a second wind-turbine blade in a wind turbine that comprises the wind-turbine blade and the second wind-turbine blade; or a previous measurement performed on a third wind-turbine blade in a different wind turbine than the wind turbine. The electronic device may further comprise an orientation sensor electrically connected to the disconnect device, wherein the orientation sensor can be configured to provide the electronic device data on position and/or orientation, and/or speed of rotation of the wind turbine blade. The electronic device may be further configured to be electrically coupled to the lightning-protection cable, when an orientation of the wind-turbine blade is within a range of pre-defined angles, such as angles below horizontal. The electronic device may further comprise a communication device configured to communicate the measurements to a master electronic device, or a remotely located computer.

The disconnect device may comprise a mechanical switch with a liquid conductor configured to selectively electrically couple to the lightning-protection cable for a range of orientation angles of the wind-turbine blade. The disconnect device may be configured to electrically couple to the lightning-protection cable for a range of orientation angles of the wind-turbine blade. Said range of orientation angles are preferably below a horizontal orientation of the wind-turbine blade. The electronic device may be mounted at or proximate to a root or hub of a wind-turbine blade, or inside of the hollow interior of the root or the hub, or within a wind-turbine blade, wherein the electronic device may further comprise a generator configured to provide power to the electronic device created at least in part as a result of motion of the wind-turbine blade.

The invention also provides for a non-transitory computer-readable storage medium for use with an electronic device, the computer-readable storage medium storing program instructions, wherein, when executed by the electronic device, the program instructions cause the electronic device to perform time-domain reflectometry measurements on a lightning-protection cable in a wind-turbine blade.

DETAILED DESCRIPTION OF THE INVENTION

An electronic device 1 that performs integrated monitoring of a wind turbine 3 (such as a land-based or an offshore wind turbine) is described. This electronic device 1 may be mounted at or proximate to a root or hub of a wind-turbine blade 20. In some embodiments, the electronic device 1 may be included inside of the hollow interior of the root or the hub, or within a wind-turbine blade 20. Moreover, the electronic device 1 may include a generator 40 that produces power for the electronic device 1 based on angular rotation of the wind turbine 3.

Figure 1:
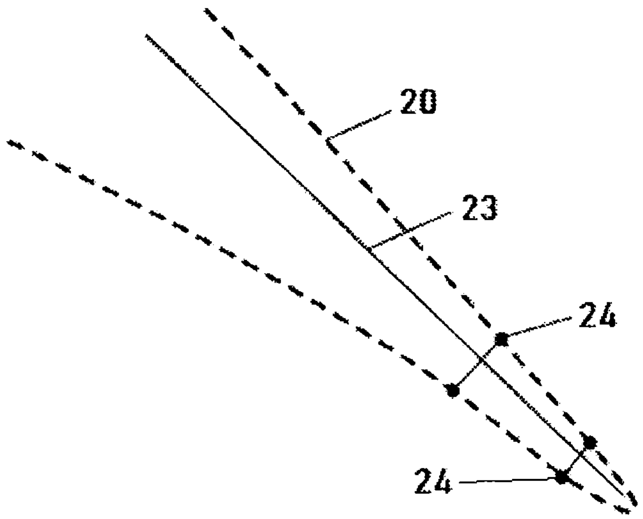
FIG. 1 schematically shows an example of a wind-turbine blade, comprising electrical cable coupled to the exterior surface of the wind turbine by a set of receptors.

During operation, the electronic device 1 may selectively electrically couple (or electrically decouple) from a lightning-protection system within a wind-turbine blade 20. Notably, because a wind-turbine blade 20 can be struck by lightning, they often include electrical wiring inside of the hollow interior and along the length of the wind-turbine blade 20. As shown in FIG. 1, which presents a drawing illustrating an example of a wind-turbine blade, this lightning-protection electrical cable 23 or wire is coupled to the exterior surface of the wind turbine 3 by a set of connectors or studs (which are sometimes referred to as 'receptors') 24, which are located as discrete potions along the length of the electrical wire (and, thus, the wind turbine). For example, the receptors 24 may be screw-type bolts, which may be made of tungsten, and which may be screwed into the wind-turbine blade 20 from the outside. The electronic device 1 may selectively electrically couple to the lightning-protection electrical cable 23 when the wind-turbine blade 20 is orientated below a horizontal direction (e.g., an orientation having an angle between 180° and 360°). When the wind-turbine blade 20 is oriented below the horizontal direction, the risk of a lightning strike on the wind-turbine blade 20 is reduced, which may reduce a risk of electrical damage to the electronic device 1. Because the wind turbine 3 may have a rotation period of, e.g., 4 s, the electronic device 1 may be electrically coupled to the lightning-protection cable 23 for up to, e.g., 2 s.

In some embodiments, the electronic device 1 may selectively electrically couple (or decouple) from the lightning-protection cable 23 using an electrical switch, which may change its configuration based at least in part on a control signal provided by control logic in the electronic device 1. However, in some embodiments, the electronic device 1 may selectively electrically couple (or decouple) from the lightning-protection cable 23 using a mercury switch. The mercury switch may electrically couple (or decouple) from the lightning-protection cable 23 mechanically, such as based on the gravity-induced motion of liquid mercury (or another liquid conductor). These embodiments may reduce the power consumption of the electronic device 1.

When the electronic device 1 is electrically coupled to the lightning-protection cable 23, the electronic device 1 may perform electronic measurements to characterize the lightning-protective system in the wind-turbine blade 20. For example, the electronic device 1 may perform time-domain reflectometry measurements. The electronic device 1 may provide an electrical signal (such as an electrical pulse or a square-wave pattern) that propagates down the length of the lightning-protection cable 23. The electrical signal may have a square shape with a fundamental frequency of 50 kHz, a duty cycle of 25%, a rise time of 24 ns and a fall time of 23 ns. Because of the electrical impedance of the lightning-protection cable 23 (such as the resistance, inductance and capacitance), the electrical signal may be broadened as it propagates. In addition, there may be reflections that occur at the locations of the set of receptors 24 and at the end of the lightning-protection cable 23 (near the tip of the wind-turbine blade 20).

Figure 2:
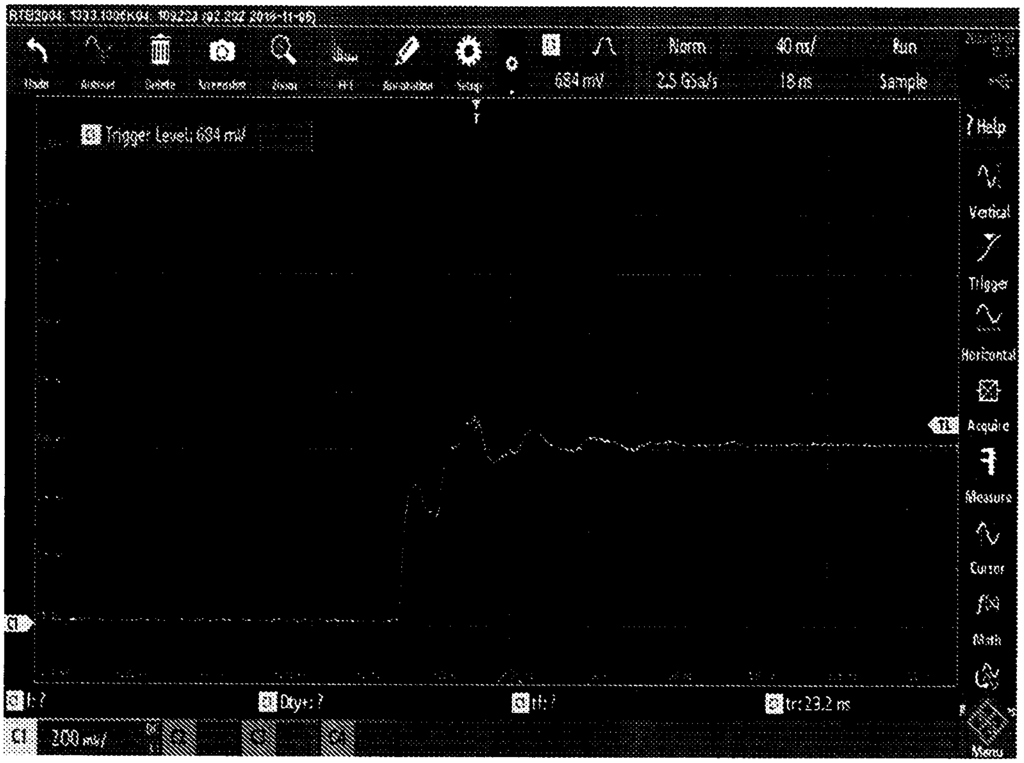
FIG. 2—a drawing illustrating measured electrical signals reflected from the lightning-protection system's cable.

The resulting reflections of the broadened electrical pulse may be subsequently received at the electronic device 1. For example, the electronic device 1 may: filter the reflected electrical signals (such as low-pass or bandpass filtering), amplify the reflected electrical signals, and convert the reflected electrical signals from the analog domain to the digital domain (e.g., using an analog-to-digital converter, e.g., using a sampling rate of 2k-250k Hz and a sample resolution of 16 bits). The electronic device 1 may perform additional filtering (in the analog domain and/or the digital domain) to correct the reflected electrical signals for the transfer function or impulse response of the wind-turbine blade 20. Moreover, the electronic device 1 may measure the amplitude and/or the phase of the reflected electrical signals. A clock signal that is used to gate the electrical signal provided by the electronic device 1 may be used as a reference during the time-domain reflectometry measurements, so that the phase of the reflected electrical signals can be measured. In some embodiments, the electronic device 1 may perform a discrete Fourier transform or another transform operation on the reflected electrical signals to determine: the amplitude of the reflected electrical signals, the phase of the reflected electrical signals, the power spectral density of the reflected electrical signal, etc. An example of measured electrical signals reflected from the cable 23 is shown on FIG. 2.

The time-domain reflectometry measurements may be used to characterize the lighting-protection system in the wind-turbine blade 20. For example, the time-domain reflectometry signature of the lighting-protection system in the wind-turbine blade 20 may be characterized after manufacturing, and this predetermined signature may be used a reference for subsequent comparison. Alternatively, or additionally, time-domain reflectometry measurements may be simulated and compared to the measurements to identify potential damage, such as based at least in part on a change in a reflected electrical signal associated with a portion of the lightning-protection system associated with a receptor 24 at a particular location along the length of a wind-turbine blade 20. In some embodiments, the analysis is performed longitudinally (such as based at least in part on measurements performed on a wind-turbine blade 20 at different timestamps) and/or in aggregate (such as based at least in part on measurements performed on multiple wind-turbine blades 20 on one or more wind turbines 3). Moreover, in some embodiments, the measurements for the wind-turbine blades 20 in a wind turbine 3 may be compared to each other in the analysis. This may allow the wind-turbine blades 20 in a wind turbine 3 to be used as references or baselines in order to detect changes as a function of time (such as following a lightning strike on at least one of the wind-turbine blades 20).

Alternatively, or additionally, in some embodiments, the analysis may be performed using a supervised machine-learning technique. For example, measurements performed on one or more wind-turbine blades 20 may be aggregated along with information indicating identified damage to the one or more wind-turbine blades 20. This dataset may then be used to train a predictive model. Subsequently measurements may be input to the pretrained predictive model, which then provides an output indicating whether potential damage (or a particular type of potential damage, such as a crack, lightning damage, leading-edge damage, etc.) to a wind-turbine blade 20 has been identified. In some embodiments, the supervised machine-learning technique may include: a neural network (such as a convolutional neural network or another type of neural network), a support vector machine technique, a classification and regression tree technique, logistic regression, LASSO, linear regression, a neural network technique and/or another linear or nonlinear supervised-learning technique. The pretrained predictive model may include a classifier or a regression model. Moreover, the pretrained predictive model may be updated or retrained as more measurements are performed on the one or more wind-turbine blades 20.

In some embodiments, there may be a separate instance of the electronic device 1 in or associated with each wind-turbine blade 20 in a wind turbine 3. For example, in a wind turbine 3 with three wind-turbine blades 20, there may be three instances of the electronic device 1. Alternatively, or additionally, in some embodiments, a single instance of the electronic device 1 may be dynamically shared by two or more wind-turbine blades 20 in a wind turbine 3. Thus, the single instance of the electronic device 1 may be used to perform measurements on a given wind-turbine blade 20 when the given wind-turbine blade 20 has an orientation between 210° and 330° (or ±60° about the downward vertical axis).

Figure 3:
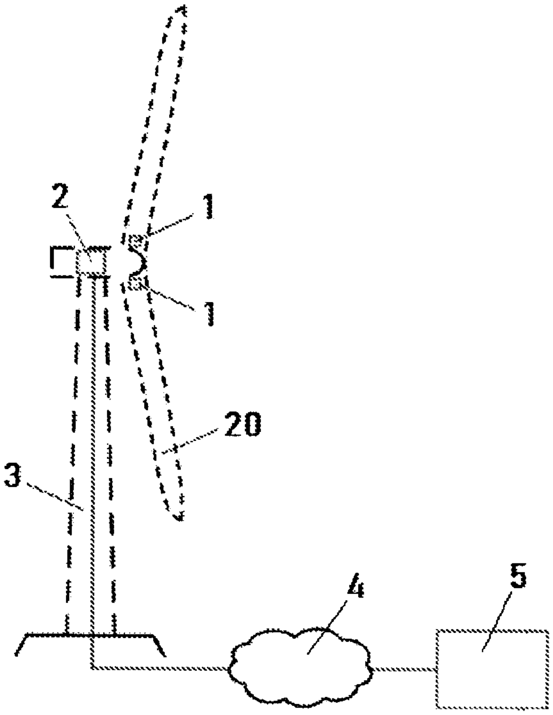
FIG. 3—illustrating an example of a wind turbine, provided with an integrated wind-turbine monitoring system according to the invention.

Moreover, as shown in FIG. 3, which presents a drawing illustrating an example of a wind turbine 3, in some embodiments the electronic device 1 may perform the measurements and may use wirelessly (or wired) communication to convey the measurements to a master electronic device 2 located proximate to the wind turbine 3 (e.g., in a base or tower of the wind turbine). This master electronic device 2 may communicate, e.g., via a network 4, such as a cellular-telephone network, the Internet, the measurements from the wind-turbine blades 20 in the wind turbine 3 to a remotely located computer 5 (such as a cloud-based computer system). In these embodiments, at least some of the analysis of the measurements (such as the identification of the potential damage) may be performed by the master electronic device 2 and/or the remotely located computer 5. Thus, in general, the analysis may be performed in a centralized and/or in a distributed manner.

Furthermore, when potential damage of a wind-turbine blade is identified or detected, the remotely located computer 5, the master electronic device 2 and/or the electronic device 1 may perform a remedial action. For example, the remedial action may include provide a notification about the potential damage to an operator of the wind turbine 3 and/or a third party that performs inspection and/or maintenance on the wind turbine 3 (such as providing the notification to an inspection device associated with the third party). The notification may include: recommending visual inspection of the wind-turbine blade, recommending maintenance of the wind-turbine blade, replacement of the wind-turbine blade and/or another operation. In some embodiments, the notification may specify a type of the potential damage and/or an approximate location (along the wind-turbine blade 20) of the identified potential damage. The analysis may indicate a range of locations along the wind-turbine blade 20 where the identified potential damage is expected.

While the preceding discussion illustrated the integrated inspection techniques with time-domain reflectometry measurements, a wide variety of measurements and physical properties may be used to assess or monitor the wind-turbine blade 20. For example, the measurements may include: electrical impedance, resistance, inductance, capacitance, etc. Moreover, these measurements may be performed in the analog domain and/or in the digital domain.

In some embodiments, the lightning-protection system in a wind-turbine blade may include components that facilitate the analysis, such as the identification of the potential damage, the type of potential damage and/or a location (or a range of locations) of the potential damage. For example, electrical components that undergo a change in a physical property (such as a dielectric disk having an associated capacitance) following one or more instances of heating (such as each instance) associated with the large electrical currents associated with one or more instances of a lightning strike may be included in the set of connectors or studs and at discrete locations along the length of the electrical wire. The change in the physical property may allow the location of a lightning strike on a wind-turbine blade to be spatially localized. Note that the electrical components may not be destroyed or damaged by the lightning strike. Consequently, the electrical components may not need to be replaced, thereby allowing such spatial localization of instances of the lightning strike (and, thus, potential damage to a wind-turbine blade 20) to be performed over the operating life of the wind-turbine blade 20. In some embodiments, temperature sensors or probes (e.g., using optical fibers) may be included in the wind-turbine blade 20, which may allow the transient temperature increase following an instance of a lighting strike to be detected, and thus the location(s) of potential damage to a wind-turbine blade 20 to be localized.

While preceding discussion illustrated the use of electrical measurements to monitor or inspect the wind-turbine blade 20, more generally the electronic device 1 may monitor or assess the wind-turbine blade 20 using a variety of measurements, which may be used instead of or in addition to the electrical measurements. Notably, the measurements performed by the electronic device 1 may include: pressure measurements, humidity measurements, acoustic measurements (and, more generally, sonic measurements), vibration measurements, acceleration measurements, orientation measurements (e.g., using a gyroscope or a magnetometer), temperature measurements, electrical measurements (such as time-domain reflectivity measurements, S-parameter frequency-domain measurements, radio-frequency transmission using a phased-antenna array on the ground, in a wind-turbine tower or in a wind-turbine blade, etc.), monitoring of a lightning-protection system, displacement measurements (such as distance or three-dimensional sensing of, e.g., wind-turbine blade flexibility), crack measurements, spark-gap measurements (such as using an external, e.g., ground or drone-based, marx generator and an antenna array), mechanical or electrical noise measurements, connector, stud or receptor measurements, optical-fiber measurements, image measurements (e.g., using a visible spectra, ultraviolet or infrared camera, a spectral camera, a passive camera, a flash or thermal impulse-assisted camera), strain measurements (e.g., using a smart nut or bolt or an optical fiber installed at a particular location in a wind-turbine blade), MEMS-based measurements, iterative measurements following mechanical assistance or repairs (such as fixing a crack or a cable, etc.) and/or another type of measurement. For example, the acoustic or sonic measurements may be performed using: a single sensor (such as a microphone), a multi-sensor, or a phased microphone array. In some embodiments, the measurements may be facilitated using active elements (such as elements that have a temporarily or permanently change to a physical property after an instance of lightning). Note that for radio-frequency transmission using a phased-antenna array on the ground, the lightning cable mounted inside a wind-turbine blade may be used as an antenna. In particular, a phased-antenna array on the ground may be able to assess the power radiated by each part of the lightning cable. Therefore, such an antenna array may be able to detect the exact shape of the radiation pattern, which may be used to evaluate if all parts of the lighting system are radiating. If some parts are not radiating (or have a change in their radiation pattern), this may indicate that they are disconnected from the main conductor (or that the impedance of their connection has changed) and that is repair is needed.

In some embodiments, the measurements may be performed passively, such as based at least in part on the vibrations of a wind-turbine blade associated with airflow, wind direction and, more generally, the aerodynamics of the wind-turbine blade 20. For example, the electronic device 1 may measure: resonance frequencies, damping, noise, sound waves or tones in the hollow interior of the wind-turbine blade 20, etc. The aerodynamics may depend on factors such as: the wind magnitude, the wind direction, an angle of the wind-turbine blade, weather conditions (such as humidity, temperature, etc.), leading-edge quality (and, thus, potential damage), etc. Alternatively, or additionally, in some embodiments, the measurements may be performed actively, such as by using mechanical tapping or an acoustic or ultrasound source. The electronic device 1 may apply a mechanical impulse or a sound wave to the wind-turbine blade, and the electronic device 1 may perform measurements of: the induced acoustic reflections, the mechanical transfer function, frequency response, resonance frequencies, damping, etc. Once again, the analysis of the measurements may involve comparison to at least another wind-turbine blade in the same wind turbine and/or to a predetermined signature of the wind-turbine blade. In general, measurements performed by the electronic device 1 may be made using one or more sensors, probes or measurement devices 10 that are included in the electronic device and/or the are coupled (e.g., electrically or optically) to the electronic device 1. Thus, the one or more sensors, probes or measurement devices 10 may be remotely located from the electronic device 1.

We now further discuss embodiments of the integrated inspection techniques. Notably, the electronic device 1 may provide a set of wind turbine 3 monitoring tools to achieve higher sampling rate monitoring of a wind-turbine blade 20 without the need to stop the turbine 3 for inspections. A wind-turbine blade 20 that includes an instance of the electronic device 1 is sometimes referred to as a 'smart blade.'

Figure 4:
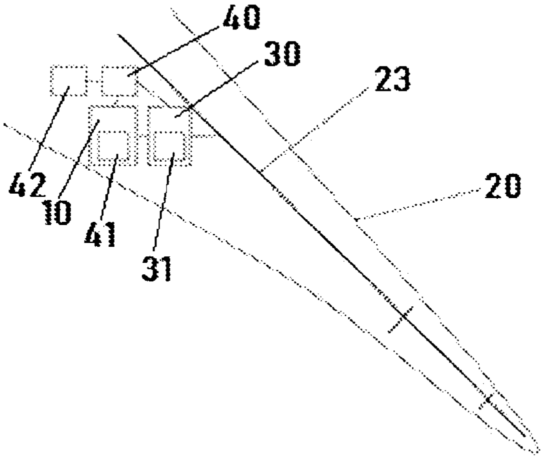
FIG. 4—illustrating an embodiment of the claimed system integrated into a wind-turbine blade, wherein the claimed system is adapted for monitoring of a lightning-protection system in a wind-turbine blade.

As shown in FIG. 4, which presents a drawing illustrating a wind-turbine blade 20, in embodiments of integrated monitoring of a lightning-protection system in a wind-turbine blade 20, an electronic device 1 that performs time-domain reflectometry measurements may be mounted inside a wind-turbine blade 20 and selectively electrically coupled to a lightning-protection cable 23. A disconnect device 30 (such as a switch or a relay) may be installed between the electronic device 1 and the lightning-protection cable 23 to keep the electronic device 1 disconnected or electrically decoupled from the lightning-protection cable 23 at most times, but electrically coupled to the lightning-protection cable 23 when an instance of a measurement is performed. This selective and dynamic electrical coupling may protect the electronic device 1 in case lightning strikes the wind-turbine blade 20.

Moreover, a mechanical power generation unit 40 may be included in the electronic device 1 or the wind-turbine blade 20 to provide power for the electronic device 1 and the disconnect device 30. Furthermore, the electronic device may include a communication device 41 that is capable of wireless communication. Additionally, an orientation sensor 31 may be included in the disconnect device 30, so that the electronic device 1 may be electrically coupled to the lightning-protection cable 23 when an orientation of the wind-turbine blade 20 is within a range of angles (such as angles below horizontal). This may reduce the possibility of the electronic device 1 being damaged from an instance of a lightning strike. The orientation sensor 31 can be configured to provide the electronic device 1 data on location and/or orientation, and/or speed of rotation of the wind turbine blade 20. This data can be used to determine whether the wind turbine blade 20 is rotating or not, what is its position in respect to the line of horizon, what is its speed of rotation, how many revolutions has made the wind turbine blade 20. Depending on the needs, this information may further be used by the electronic device 1 to calculate when the electronic device 1 should be connected to and/or disconnected from the lightning-protection cable 23. According to one embodiment, the electronic device may be configured to provide a command to electrically connect it to the lightning-protection cable 23, when the wind turbine blade 20 has made certain number of revolutions (e.g. each 1000 of revolutions), thereby ensuring regular measurement of the lightning-protection cable 23, and/or to provide a command to electrically connect the electronic device 1 to the lightning-protection cable 23, when the wind turbine blade 20 is positioned below a horizontal orientation.

An energy storage device 42 (such as a rectifier and a battery) may be used to accumulate generated electricity and to provide it to the electronic device 1 and/or the disconnect device 30 when the wind-turbine blade 20 is not rotating or providing sufficient mechanical energy to the power generation unit 40.

During an instance of the measurement, the electronic device 1 may provide an electrical signal into the lightning-protection cable 23 and then may measure the reflected electrical signals (which are sometimes referred to as a signature). Instance of the signature may be measured periodically (such as every half-rotation period or the wind turbine blade 20) or as-need and wirelessly reported (e.g., to the master electronic device 2), such as when a change in the signature (relative to a predetermined signature) is detected. In general, a change in the signature may indicate that a physical property of the lightning-protection cable 23 has changed and that a new inspection of the wind-turbine blade 20 is needed.

Figure 5:
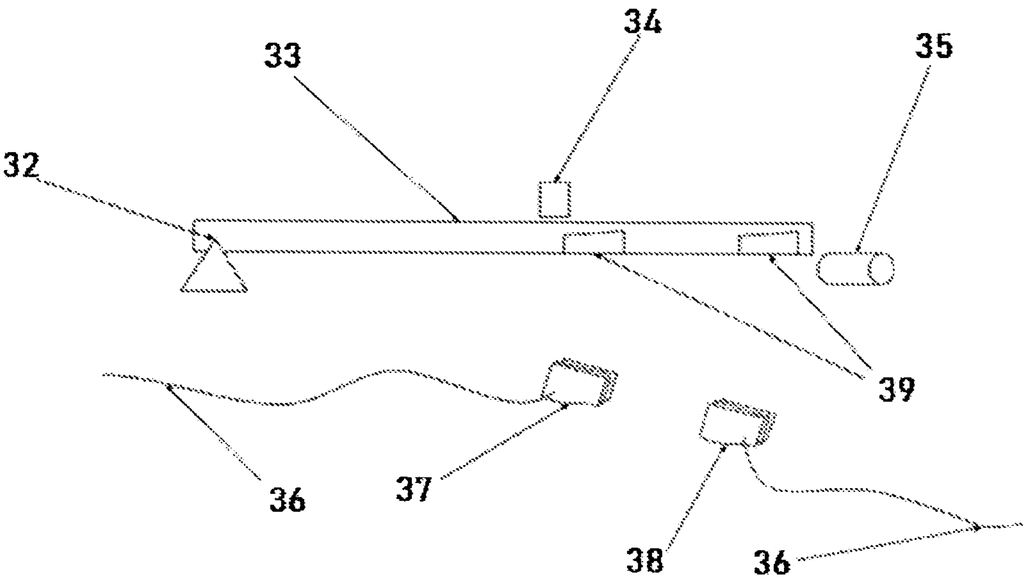
FIG. 5—illustrates an embodiment of the disconnect device configured to be installed between the electronic device and the lightning-protection cable, the disconnect device shown in disengaged position.
Figure 6:
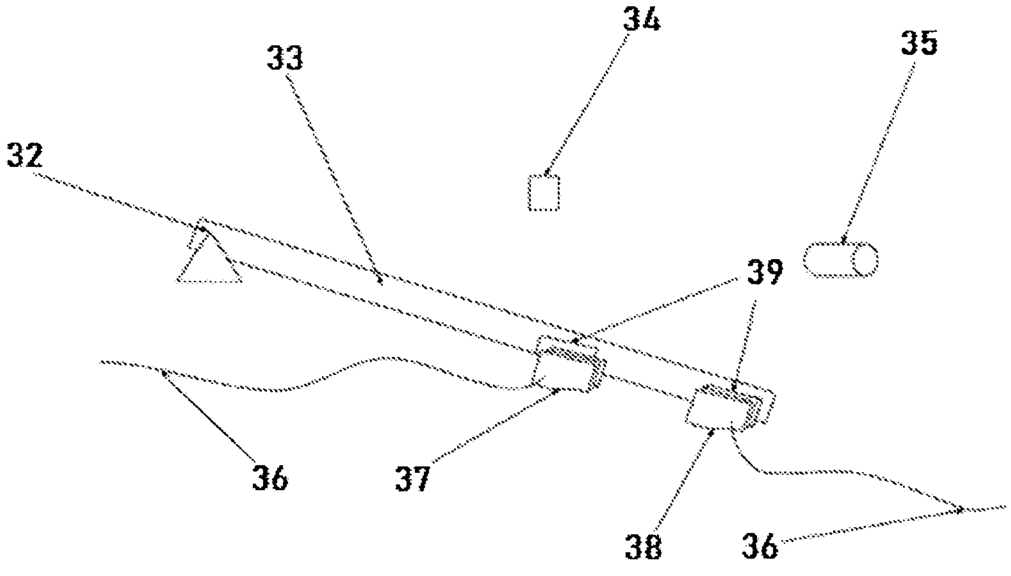
FIG. 6—the embodiment of the disconnect device shown in engaged position.
Figure 7:
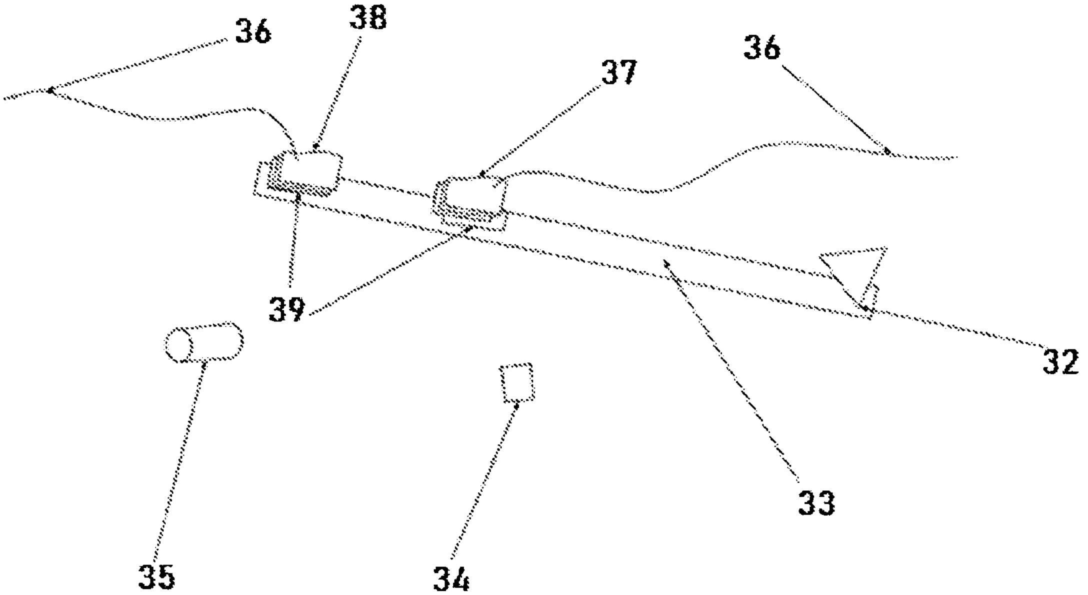
FIG. 7—the embodiment of the disconnect device shown again in engaged position after wind turbine blade rotation.

FIGS. 5-7 present drawings illustrating an example of the disconnect device 30. The disconnect device 30 may include: a hinge 32 having a rotation center point; a rotating lever 33 with connection points; a permanent magnet 34; an electro-magnet 35, a cable 36 to the electronic device 1 that performs the measurements; a connection socket one 37; a connection socket two 38; a cable 36 to the lightning-protection cable; and connection points 39 that go into connection sockets one 37 and two 38. The disconnect device 30 may be installed on or inside of a wind-turbine blade 20. The hinge 32, the permanent magnet 34, the electromagnet 35, the cable 36, the connection sockets one 37 and two 38 may have fixed positions relative to the wind-turbine blade 20, and the rotating lever 33 may be connected with the hinge 32 at the rotation center point.

The rotating lever 33 is typically connected to the permanent magnet 34, and may rotate together with the wind-turbine blade 20. As shown in FIG. 5, the permanent magnet 34 may be strong enough to keep the rotating lever 33 attached at all wind-turbine blade rotation angles. This may also mean that the connection sockets one 37 and two 38 remain disconnected most of the time.

As shown in FIG. 6, in order to connect connection sockets one 37 and two 38 to make measurements, a short impulse may be sent to the electro-magnet 35 at blade 20 rotation angle when the rotating lever 33 is parallel to the ground (or the horizontal orientation) on the right side of the hinge 32 (as shown in FIG. 5). The electro-magnet 35 may pull the lever 33 and overcome the force of the permanent magnet 34. As the lever 33 gets disconnected from the permanent magnet 34, gravity may pull it down and connect the connection sockets one 37 and two 38 with the connection points 39. Both connection points 39 may be connected by the lever 33, thereby providing electrical connections to connection sockets one 37 and two 38.

Moreover, as shown in FIG. 7, as the wind-turbine blade 20 continues rotation (e.g., clockwise), after 180° of rotation the lever 33 is on the left side of the hinge 32. Gravity then pulls it out of the connection sockets one 37 and two 38 and it may fall back and connect with the permanent magnet 34.

The disconnection device 30 may offer several benefits, including: it may not consume electricity in a standby state; in order to establish a connection only a short electro-magnetic pulse is needed; the isolation distance is relatively large; it may be very reliable because there are few moving components; and/or it may ensure that a connection will be made only when the wind-turbine blade 20 has an orientation below horizontal (e.g., when it is pointing downward).

In some embodiments, the electronic device 1 may perform measurements using receptors 24 monitoring. For example, an optical-fiber thermometer (which may include a gallium arsenide (GaAs) semiconductor crystal) may be attached to each wind-turbine blade receptors 24. The optical fiber may be routed to the nearest processing unit (such as the electronic device 1, which may be located near the root of the wind-turbine blade 20). In case of a lightning strike, the receptors 24 will heat up and this may be detected by the optical-fiber thermometer. A similar component or device may be attached to the main lightning-protection cable 23 near the root of the wind-turbine blade 20. By detecting instances of lightning on the main lightning-protection cable 23 and on the connectors or receptors 24, it may be possible to detect if a lightning strike hit a particular connector or receptor 24 or did damage to the wind-turbine blade 20.

As noted previously, separately or in addition to the time-domain reflectometry measurements, the electronic device 1 may perform one or more other types of measurements. For example, in order to monitor a drainage hole in the wind-turbine blade 20, the electronic device 1 may include a humidity sensor and/or an air-pressure sensor. While it may be difficult to monitor the drainage hole directly, it may be possible to assess its functionality by measuring the overall humidity level in the wind-turbine blade 20. Moreover, a pressure sensor may be used to measure pressure changes for a stationary and a rotating wind-turbine blade 20. Notably, because the drainage hole is mounted on a low-pressure position of the wind-turbine blade 20, rotating the wind-turbine blade may lower the overall pressure inside the wind-turbine blade 20.

Alternatively, or additionally, the electronic device 1 may include one or more image sensors (such as a visible or an infrared camera). For example, a pan, tilt and zoom camera may allow the electronic device 1 to inspect the wind-turbine blade for cracks (e.g., at the root). In some embodiments, the electronic device 1 may include a light source, which may be synchronized to operation of the one or more image sensors for efficient power usage.

In yet some embodiments, the electronic device 1 may include or may be coupled to one or more microphones. For example, one or more optical-fiber microphones may be installed inside the wind-turbine blade 20 at different locations. As the wind-turbine blade 20 rotate, it may create turbulence in the air that results in specific sound vibrations. If the wind-turbine blade 20 is damaged, then the turbulence may change, which in turn may change the sound. Note that the leading-edge erosion level may be detected based at least in part on the change in the sound.

Figure 8:
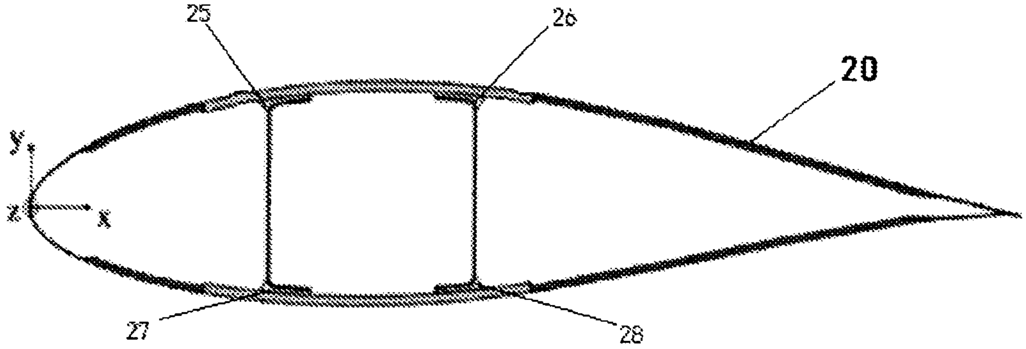
FIG. 8—a schematic cross-section of a wind-turbine blade, which comprises displacement sensors configured to allow the claimed system to perform displacement measurements of the wind turbine blade's elements.

Moreover, in some embodiments, the electronic device 1 may perform measurements that detect potential cracks in the wind-turbine blade 20. Typically, wind-turbine blades 20 are made out of webs that are glued to an outer shell in order to achieve lightweight and a strong structure. However, if a web gets disconnected from the outer shell, then the wind-turbine blade 20 may break. Currently, inspection is done using internal inspection robots or humans that go inside the wind-turbine blade 20 and look for cracks in the joint sections. As shown in FIG. 8, which presents a drawing illustrating an example of a wind-turbine blade 20, in the disclosed integrated inspection techniques there may be displacement sensors (such as optical displacement sensors) that are located (e.g., glued) at joint locations 25, 26, 27 and 28. Moreover, serially connected optical fibers may connect the optical displacement sensors. The electronic device 1 may perform displacement measurements via the optical fibers (e.g., via a reflective termination of an optical fiber or a returning loop).

Furthermore, in some embodiments, the electronic device 1 may perform integrated inspection of a wind-turbine blade 20 in conjunction with an internal crawler robot or drone. For example, a crawler robot or drone may be installed inside of a wind-turbine blade 20 for visual or other inspection. Different techniques may be used to move the crawler robot or drone inside the wind-turbine blade 20. The crawler robot or drone may wait for low wind conditions when the wind-turbine blade 20 is stationery before moving and performing measurements. Alternatively, or additionally, a rail or rope may be installed inside the wind-turbine blade 20 and the crawler robot or drone may use wind-turbine blade 20 rotation for its advantage to move along the length of the wind-turbine blade 20. If the crawler robot or drone wants to move away from the root of the wind-turbine blade 20 towards the tip, then it may wait when the tip is pointing downwards and then ease or release a brake to slide towards the tip. In order to get back, the crawler robot or drone may ease or release a brake when the tip of the wind-turbine blade is pointing up or vertically.

Additionally, in some embodiments, the integrated inspection techniques may be used with a ground-based inspection device (such as a ground-based lightning-protection inspection device). For example, a system may include: a transportation vehicle, a high-voltage generator, a winch, an electrical cable and a drone that is used to generate a high-voltage spark for a wind-turbine lightning-protection system test.

The drone may be tethered to the winch with a light, but conductive cable. Moreover, the winch may be positioned on top of the high-voltage generator. Furthermore, the high-voltage generator may be optionally mounted on an elevated isolation platform. Additionally, the drone may include multiple image sensors (such as cameras).

Figure 9:
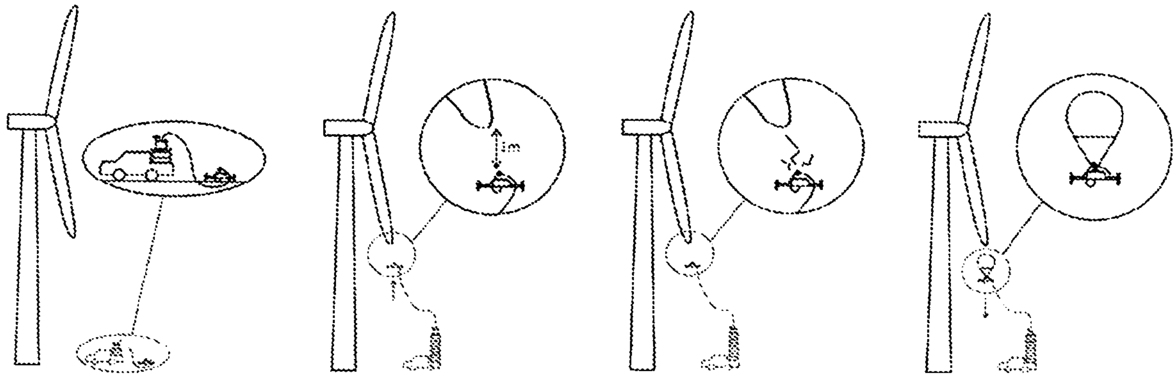
FIG. 9—schematically illustrating a wind turbine lightning-protection system test.

As shown in FIG. 9, which presents drawings illustrating a lightning-protection system test, during operation the drone may be flown up to a height that is, e.g., about one meter below the tip of the wind-turbine blade 20. Then, the high-voltage generator may charge to a voltage that can create spark exceeding the distance from the drone to the tip of the wind-turbine blade 20. If the wind-turbine blade 20 has a working lightning-protection system, then flash-over will happen from the drone to the tip of the wind-turbine blade 20. This flash-over may be photographed with several cameras to assess the spark length. Moreover, the spark length may be analyzed to determine the spark-gap sizes inside the wind-turbine blade. Additionally, an antenna cluster may be set up on the ground to triangulate and locate or determine the spark locations and sizes.

While the preceding embodiments were illustrated with particular architectures, in other embodiments there may be: fewer or additional components, positions of one or more components may be changed, two or more components may be combined, and/or a single component may be divided into two or more components. Furthermore, while the embodiments of the integrated inspection techniques were illustrated with particular operations, in other embodiments, there may be fewer or additional operations, the order of at least two operations may be changed, two or more operations may be combined, and/or a single operation may be divided into two or more operations.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art, for example, AC coupling and/or DC coupling may be used.

In some embodiments, functionality in these circuits, components, electronic devices and/or computers is implemented in hardware and/or in software as is known in the art. For example, some or all of the functionality of these embodiments may be implemented in one or more: application-specific integrated circuit (ASICs), field-programmable gate array (FPGAs), graphics processing units (GPUs) and/or one or more digital signal processors (DSPs). Furthermore, the circuits and components may be implemented using bipolar, PMOS and/or NMOS gates or transistors, and signals in these embodiments may include digital signals that have approximately discrete values and/or analog signals that have continuous values.

Moreover, in some embodiments, at least some of the functionality of the electronic device may be implemented using one or more integrated circuits. An output of a process for designing such an integrated circuit, or a portion of an integrated circuit, may be a non-transitory computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

The invention claimed is:

1. An integrated wind-turbine monitoring electronic device, comprising:

a disconnect device configured to selectively electrically couple to a lightning-protection cable in a wind-turbine blade;

a measurement device, electrically coupled to the disconnect device, configured to perform, when the disconnect device is selectively electrically coupled to the lightning-protection cable, time-domain reflectometry measurements of lightning-protection cable by performing operations comprising: (i) providing an electrical signal to the lightning-protection cable; and (ii) measure reflected electrical signals from the lightning-protection cable; and an orientation sensor electrically connected to the disconnect device, wherein the orientation sensor is configured to provide the electronic device data on position and/or orientation, and/or speed of rotation of the wind turbine blade.

2. The electronic device of claim 1, wherein the electronic device comprises control logic configured to selectively provide a control signal to the disconnect device to change a state of the disconnect device from connected to disconnected and vice versa.

3. The electronic device of claim 1, wherein the measurement device is configured to measure: an amplitude of the reflected electrical signals, a phase of the reflected electrical signals, or both.

4. The electronic device of claim 1, wherein the measurement device is further configured to analyze the measured reflected electrical signals to detect whether there is potential damage to the lightning-protection cable.

5. The electronic device of claim 4, wherein the analysis is based at least in part on a predetermined signature of the lightning-protection cable.

6. The electronic device of claim 4, wherein the analysis is performed using a pretrained predictive model, comprising a neural network; or a supervised-learning model.

7. The electronic device of claim 4, wherein the analysis is based at least in part on: a previous measurement performed on the wind-turbine blade; a previous measurement performed on a second wind-turbine blade in a wind turbine that comprises the wind-turbine blade and the second wind-turbine blade; or a previous measurement performed on a third wind-turbine blade in a different wind turbine than the wind turbine.

8. The electronic device of claim 4, wherein the analysis determines a type of the potential damage, a location or a range of location on the wind-turbine blade where the potential damage has occurred, or both.

9. The electronic device of claim 1, wherein the electronic device is configured to be electrically coupled to the lightning-protection cable, when an orientation of the wind-turbine blade is within a range of pre-defined angles.

10. The electronic device of claim 1, wherein the electronic device comprises a communication device configured to communicate the measurements to a master electronic device, or a remotely located computer.

11. The electronic device of claim 1, wherein the disconnect device comprises a mechanical switch with a liquid conductor configured to selectively electrically couple to the lightning-protection cable for a range of orientation angles of the wind-turbine blade.

12. The electronic device of claim 1, wherein the disconnect device is configured to electrically couple to the lightning-protection cable for a range of orientation angles of the wind-turbine blade.

13. The electronic device of claim 12, wherein the range of orientation angles are below a horizontal orientation of the wind-turbine blade.

14. The electronic device of claim 1, wherein the electronic device is mounted at or proximate to a root or hub of the wind-turbine blade, or inside a hollow interior of the root or hub of the wind-turbine blade, wherein the electronic device further comprises a generator configured to provide power to the electronic device created at least in part as a result of motion of the wind-turbine blade.

* * * * *